(12) United States Patent
Tsai et al.

(10) Patent No.: US 8,999,194 B1
(45) Date of Patent: Apr. 7, 2015

(54) ETCHING SOLUTION CAPABLE OF EFFECTIVELY REDUCING GALVANIC EFFECT

(71) Applicant: E-Chem Enterprise Corp., Bade, Taoyuan County (TW)

(72) Inventors: Cheng-Ying Tsai, Bade (TW); Cheng-Kai Liao, Bade (TW); Su-Fei Hsu, Bade (TW)

(73) Assignee: E-Chem Enterprise Corp. (TW)

( * ) Notice: Subject to any disclaimer, the term of this patent is extended or adjusted under 35 U.S.C. 154(b) by 0 days.

(21) Appl. No.: 14/187,319

(22) Filed: Feb. 24, 2014

(51) Int. Cl.
*C09K 13/06* (2006.01)

(52) U.S. Cl.
CPC ...................... *C09K 13/06* (2013.01)

(58) Field of Classification Search
USPC .................. 252/79.1–79.4; 438/689; 349/113
See application file for complete search history.

(56) References Cited

U.S. PATENT DOCUMENTS

| 7,537,709 B2 * | 5/2009 | Cooper et al. ............... 252/79.1 |
| 2005/0067378 A1 * | 3/2005 | Fuerhaupter et al. ........... 216/34 |

OTHER PUBLICATIONS

Preventing Galvanic Corrosion, (2008) pp. 1-3.*

* cited by examiner

*Primary Examiner* — Duy Deo
*Assistant Examiner* — Maki Angadi (57) ABSTRACT

The present invention is to provide an etching solution capable of effectively reducing Galvanic effect, wherein the etching solution is obtained by way of dissolving an etchant and a nitrogen containing five-member heterocyclic compound in water. Thus, when at least one first metal (e.g., gold) and at least one second metal (e.g., copper) disposed on a substrate is treated with a wet etching process by using this etching solution, the nitrogen containing five-member heterocyclic compound would form an organic protecting film on the first metal having higher reduction potential, so as to effectively avoid the second metal from being over etched resulted from the Galvanic effect.

12 Claims, 7 Drawing Sheets

ETCHING SOLUTION CAPABLE OF EFFECTIVELY REDUCING GALVANIC EFFECT

BACKGROUND OF THE INVENTION

1. Field of the Invention

The present invention relates to a etching solution, and more particularly, to an etching solution capable of effectively reducing Galvanic effect.

2. Description of the Prior Art

In the latter manufacturing process of printed circuit boards and integrated circuits, usually using the photolitho-etching technology with specific etching solution (e.g., ferric chloride etching solution, copper chloride etching solution or alkaline etching solution) so as to produce metal layer of specific pattern (i.e., wires or solder pads) on the printed circuit boards and integrated circuits. However, it would occur the undercut by using these etching solutions.

Figure 1:
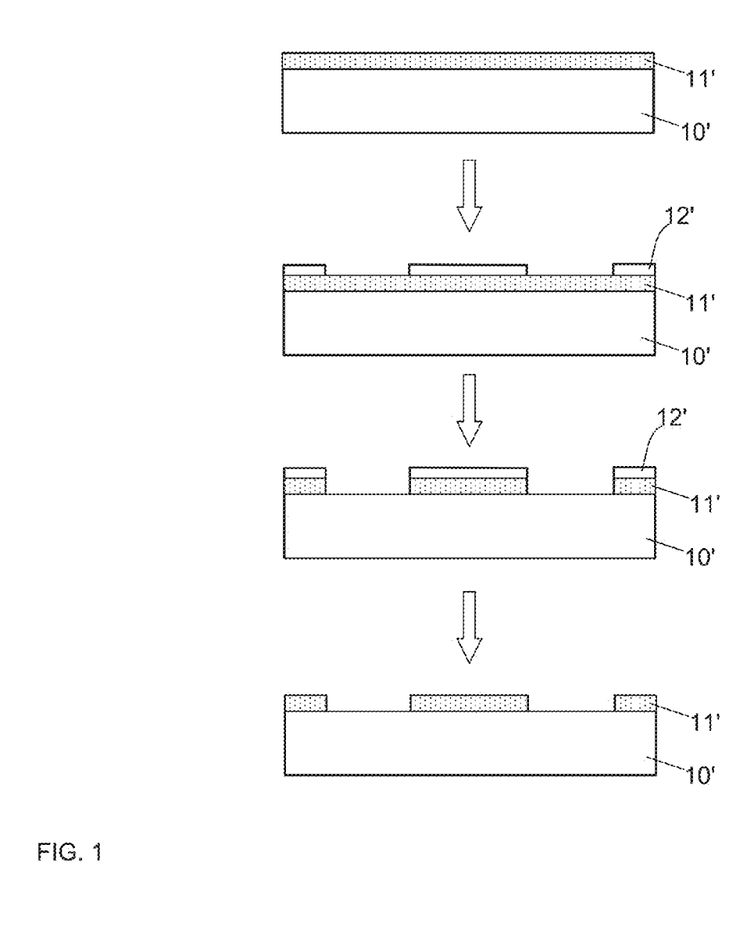
FIG. 1 and FIG. 2 are schematic diagrams of manufacturing process of producing specific pattern on the printed circuit board.
Figure 2:
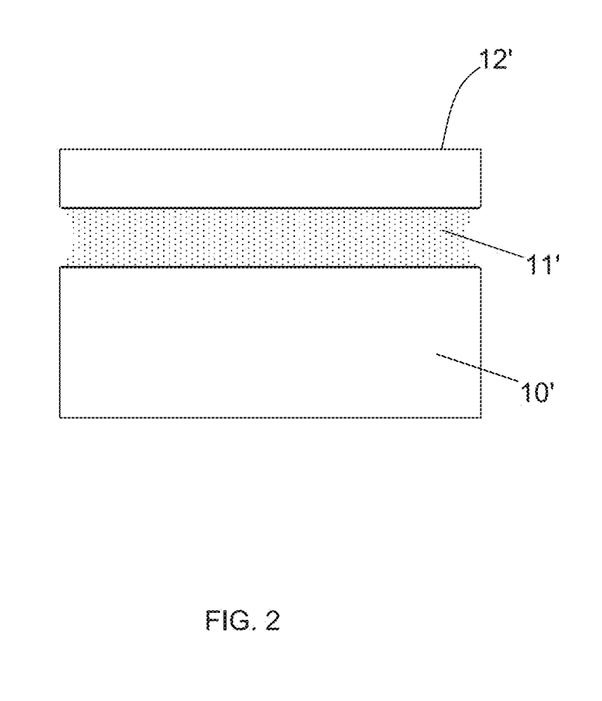

Please refer to FIG. 1 and FIG. 2, which illustrate schematic diagrams of manufacturing process of producing specific pattern on the printed circuit board. As FIG. 1 shows, in general manufacturing process of cooper wires of the printed circuit boards, firstly forming a etch-resisting layer 12' having a specific pattern on the cooper layer 11' of the substrate 10'; next, removing the cooper layer 11' not covered by the etch-resisting layer 12' through the wet etching process; finally, after removing the etch-resisting layer 12', the cooper layer 11' having the specific pattern would be formed on of the substrate 10'. However, as FIG. 2 shows, since the command of new generation products to the line width of the printed circuit board, the cooper layer 11' covered by the etch-resisting layer 12' would occur lateral etching when produce the extremely thin cooper wires, which is called undercut.

Figure 3:
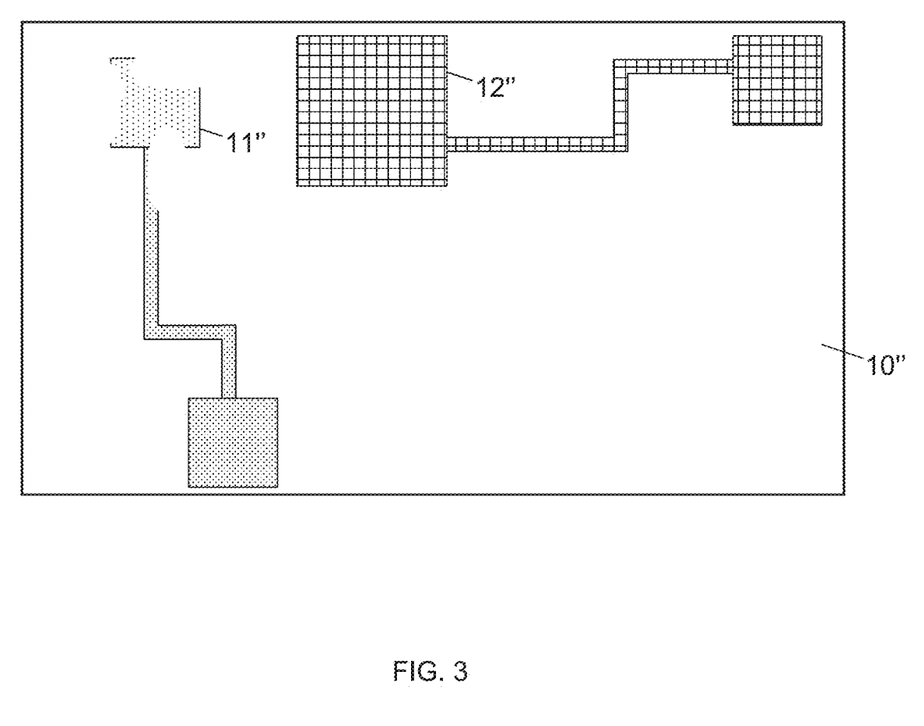
FIG. 3 is a top view diagram of the printed circuit board of gold and copper combination.

Besides, since the popularity of smart phones, tablet computers and consumptive electronic products, the traditional printed circuit boards using cooper wire to transfer signals are no longer affordable to the application of these consumptive electronic products. Therefore, a printed circuit board composited by cooper and gold has been provided in order to deal with the aforesaid problems of consumptive electronic products. Please refer to FIG. 3, which illustrates a top view diagram of the printed circuit board of gold and copper combination. As FIG. 3 shows, a copper wire 11" and a gold wire 12" are manufactured by a substrate 10", wherein the reduction potential of the gold wire 12" is higher than the reduction potential of the copper wire 11"; hence, the cooper layer 11" connected to the gold wire 12" would be over etched when produce the copper wire 11" and the gold wire 12" through wet etching process.

Accordingly, the inventor of the present application has made great efforts to make inventive research thereon and eventually provided an etching solution capable of effectively reducing Galvanic effect.

SUMMARY OF THE INVENTION

The primary objective of the present invention is to provide an etching solution capable of effectively reducing Galvanic effect, wherein the etching solution is obtained by way of dissolving an etchant and a nitrogen containing five-member heterocyclic compound in water. Thus, when at least one first metal (e.g., gold) and at least one second metal (e.g., copper) disposed on a substrate are treated with a wet etching process by using this etching solution, the nitrogen containing five-member heterocyclic compound would form an organic protecting film on the first metal having higher reduction potential, so as to effectively avoid the second metal from being over etched resulted from the Galvanic effect caused by the first metal.

Accordingly, in order to achieve the primary objective of the present invention, the inventor of the present invention proposes an etching solution capable of effectively reducing Galvanic effect, comprising:

an etchant, dissolved in a solvent so as to form an etching solution; and a nitrogen containing five-member heterocyclic compound, dissolved in the etching solution for forming an organic protecting film on the surface of the first metal during the wet etching process;

wherein the content of the etching solvent dissolved in the solution is ranged from 5 g/L to 250 g/L, and the content of the nitrogen containing five-member heterocyclic compound dissolved in the etching solution is ranged from 0.01 g/L to 50 g/L.

In the present invention, the aforesaid nitrogen containing five-member heterocyclic compound can be represented by following chemical formula (1) or chemical formula (2),

[Chemical Formula (1)]

[Chemical Formula (2)]

wherein "R1" in the chemical formula (1) and chemical formula (2) represents a first organic group or hydrogen, and the aforesaid first organic group is selected from the group consisting of: ether, alcohol, acid, alkyl, alkene, alkyne, benzene, phenol, and benzoic acid.

Moreover, the nitrogen containing five-member heterocyclic compound represented by chemical formula (2) can further contain at least one second organic group or hydrogen, such that the nitrogen containing five-member heterocyclic compound becomes a positive ion, and then through making the nitrogen containing five-member heterocyclic compound further contain at least one negative ion to achieve charge balance for the chemical structure of the nitrogen containing five-member heterocyclic compound. Wherein the nitrogen containing five-member heterocyclic compound containing one second organic group or hydrogen is represented by following chemical formula (3) or chemical formula (4); moreover, the nitrogen containing five-member heterocyclic compound containing two second organic groups or hydrogen is represented by following chemical formula (5),

[Chemical Formula (3)]

[Chemical Formula (4)]

[Chemical Formula (5)]

wherein "R2" in the chemical formula (3), (4), or (5) represents a second organic group or hydrogen, and the aforesaid second organic group is selected from the group consisting of: ether, alcohol, acid, alkyl, alkene, alkyne, benzene, phenol, and benzoic acid; moreover, the negative ion is selected from the group consisting of: $F^-$, $Cl^-$, $Br^-$, $I^-$, $BF_4^-$, $SO_4^{2-}$, and $HSO_4^-$.

In addition, the nitrogen containing five-member heterocyclic compound can be represented by following chemical formula (6) or chemical formula (7), wherein "R1" in the chemical formula (6) and chemical formula (7) represents a first organic group or hydrogen, and the aforesaid first organic group is selected from the group consisting of: ether, alcohol, acid, alkyl, alkene, alkyne, benzene, phenol, and benzoic acid.

[Chemical Formula (6)]

[Chemical Formula (7)]

The nitrogen containing five-member heterocyclic compound represented by following chemical formula (7) can further contain at least one second organic group or hydrogen, such that the nitrogen containing five-member heterocyclic compound becomes a positive ion, and then through making the nitrogen containing five-member heterocyclic compound further contain at least one negative ion to achieve charge balance for the chemical structure of the nitrogen containing five-member heterocyclic compound. Wherein the nitrogen containing five-member heterocyclic compound containing one second organic group or hydrogen is represented by following chemical formula (8) or chemical formula (9); moreover, the nitrogen containing five-member heterocyclic compound containing two second organic groups or hydrogen is represented by following chemical formula (10),

[Chemical Formula (8)]

[Chemical Formula (9)]

[Chemical Formula (10)]

wherein "R2" in the chemical formula (8), (9), or (10) represents a second organic group or hydrogen, and the aforesaid second organic group is selected from the group consisting of: ether, alcohol, acid, alkyl, alkene, alkyne, benzene, phenol, and benzoic acid; moreover, the negative ion is selected from the group consisting of: $F^-$, $Cl^-$, $Br^-$, $I^-$, $BF_4^-$, $SO_4^{2-}$, and $HSO_4^-$.

Furthermore, the nitrogen containing five-member heterocyclic compound can be represented by following chemical formula (11), wherein "R1" in the chemical formula (11) represents a first organic group or hydrogen, and the aforesaid first organic group is selected from the group consisting of: ether, alcohol, acid, alkyl, alkene, alkyne, benzene, phenol, and benzoic acid.

[Chemical Formula (11)]

The nitrogen containing five-member heterocyclic compound represented by the chemical formula (11) can further contain at least one second organic group or hydrogen, such that the nitrogen containing five-member heterocyclic compound becomes a positive ion, and then through making the nitrogen containing five-member heterocyclic compound further contain at least one negative ion to achieve charge balance for the chemical structure of the nitrogen containing five-member heterocyclic compound. Wherein the nitrogen containing five-member heterocyclic compound containing one second organic group or hydrogen is represented by following chemical formula (12), (13) or formula (14); the nitrogen containing five-member heterocyclic compound containing two second organic groups or hydrogen is represented by following chemical formula (15), (16), or (17); moreover, the nitrogen containing five-member heterocyclic compound containing three second organic groups or hydrogen is represented by following chemical formula (18),

[Chemical Formula (12)]

[Chemical Formula (13)]

[Chemical Formula (14)]

[Chemical Formula (15)]

[Chemical Formula (16)]

[Chemical Formula (17)]

[Chemical Formula (18)]

wherein "R2" in the chemical formula (12) to chemical formula (18) represents a second organic group or hydrogen, and the aforesaid second organic group is selected from the group consisting of: ether, alcohol, acid, alkyl, alkene, alkyne, benzene, phenol, and benzoic acid; moreover, the negative ion is selected from the group consisting of: $F^-$, $Cl^-$, $Br^-$, $I^-$, $BF_4^-$, $SO_4^{2-}$, and $HSO_4^-$.

BRIEF DESCRIPTION OF THE DRAWINGS

The invention as well as a preferred mode of uses and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe an etching solution capable of effectively reducing Galvanic effect according to the present invention, embodiments of the present invention will be described in detail with reference to the attached drawings hereinafter.

The etching solution capable of effectively reducing Galvanic effect according to the present invention is used to treating a wet etching process to a first metal and a second metal disposed on a substrate, wherein the reduction potential of the first metal is greater than the reduction potential of the second metal. Consequently, the first metal is selected from the group consisting of: Au, Pt, Ag, Cu, Sn, Ni, and Al and the second metal is selected from the group consisting of: Al, Ni, Sn, Cu, Ag, Pt, Ti, Fe, Co, and Cr. Moreover, the substrate is selected from the group consisting of: printed circuit board, wafer, glass substrate, gallium arsenide, and alumina.

Continuously describing the etching solution capable of effectively reducing Galvanic effect according to the present invention which consists of a solvent, an etchant and a nitrogen containing five-member heterocyclic compound, wherein the solvent is water ($H_2O$), and the etchant is dissolved in the solvent so as to form the etching solution. In the present invention, it does not limit the exemplary embodiment of the etchant, so that the etchant can be $H_2O_2$—$H_2SO_4$, $H_2O_2$—$H_3PO_4$, $CuCl_2$—HCl, $FeCl_2$—HCl, HCl—$HNO_3$, $Na_2S_2O_8$, or $KHSO_5 \cdot KHSO_4$—$K_2SO_4$.

In the present invention, the nitrogen containing five-member heterocyclic compound is dissolved in the etching solution for forming an organic protecting film during the wet etching process, especially for forming an organic protecting film on the surface of the first metal having higher reduction potential. Besides, the content of etching solvent dissolved in the solution is ranged from 5 g/L to 250 g/L, and the content of the nitrogen containing five-member heterocyclic compound dissolved in the etching solution is ranged from 0.01 g/L to 50 g/L. Moreover, it needs to emphasize that the nitrogen containing five-member heterocyclic compound is triazole compound and the basic chemical structure can be represented by following chemical formula (1) and chemical formula (2),

[Chemical Formula (1)]

[Chemical Formula (2)]

wherein "R1" in the chemical formula (1) and chemical formula (2) represents hydrogen or a first organic group selected from the group consisting of: ether, alcohol, acid, alkyl, alkene, alkyne, benzene, phenol, and benzoic acid; besides, the nitrogen containing five-member heterocyclic compound represented by following chemical formula (1) is a 3-R1-1,2,4-triazole and the nitrogen containing five-member heterocyclic compound represented by following chemical formula (2) is a 1,3,5-R1-1,2,4-triazole.

Moreover, the nitrogen containing five-member heterocyclic compound represented by the chemical formula (2) can further contain at least one second organic group or hydrogen, such that the nitrogen containing five-member heterocyclic compound becomes a positive ion, and then through making the nitrogen containing five-member heterocyclic compound further contain at least one negative ion to achieve charge balance for the chemical structure of the nitrogen containing five-member heterocyclic compound. Wherein the nitrogen containing five-member heterocyclic compound containing one second organic group or hydrogen is represented by following chemical formula (3) or chemical formula (4); moreover, the nitrogen containing five-member heterocyclic compound containing two second organic groups or hydrogen is represented by following chemical formula (5),

[Chemical Formula (3)]

[Chemical Formula (4)]

[Chemical Formula (5)]

wherein "R2" in the chemical formula (3), (4), or (5) represents a second organic group or hydrogen, and the aforesaid second organic group is selected from the group consisting of: ether, alcohol, acid, alkyl, alkene, alkyne, benzene, phenol, and benzoic acid; moreover, the negative ion is selected from the group consisting of: $F^-$, $Cl^-$, $Br^-$, $I^-$, $BF_4^-$, $SO_4^{2-}$, and $HSO_4^-$.

Besides, the nitrogen containing five-member heterocyclic compound can be represented by following chemical formula (6) or chemical formula (7), wherein "R1" in the chemical formula (6) and chemical formula (7) represents a first organic group or hydrogen, and the first organic group is selected from the group consisting of: ether, alcohol, acid, alkyl, alkene, alkyne, benzene, phenol, and benzoic acid.

[Chemical Formula (6)]

[Chemical Formula (7)]

Similarly, "R1" in the chemical formula (6) and chemical formula (7) represents hydrogen or a first organic group selected from the group consisting of: ether, alcohol, acid, alkyl, alkene, alkyne, benzene, phenol, and benzoic acid; besides, the nitrogen containing five-member heterocyclic compound represented by the chemical formula (6) is a 4-R1-1,2,3-triazole and the nitrogen containing five-member heterocyclic compound represented by aforesaid chemical formula (7) is a 1,4,5-R1-1,2,3-triazole.

Inheriting to above descriptions, the nitrogen containing five-member heterocyclic compound represented by the chemical formula (7) can further contain at least one second organic group or hydrogen, such that the nitrogen containing five-member heterocyclic compound becomes a positive ion, and then through making the nitrogen containing five-member heterocyclic compound further contain at least one negative ion to achieve charge balance for the chemical structure of the nitrogen containing five-member heterocyclic compound. Wherein the nitrogen containing five-member heterocyclic compound containing one second organic group or hydrogen is represented by following chemical formula (8) or chemical formula (9); moreover, the nitrogen containing five-member heterocyclic compound containing two second organic groups or hydrogen is represented by following chemical formula (10),

[Chemical Formula (8)]

[Chemical Formula (9)]

[Chemical Formula (10)]

wherein the "R2" in the chemical formula (8), chemical formula (9), or chemical formula (10) represents a second organic group or hydrogen, and the aforesaid second organic group is selected from the group consisting of: ether, alcohol, acid, alkyl, alkene, alkyne, benzene, phenol, and benzoic acid; moreover, the negative ion is selected from the group consisting of: $F^-$, $Cl^-$, $Br^-$, $I^-$, $BF_4^-$, $SO_4^{2-}$, and $HSO_4^-$.

Herein, it needs to further explain that, the nitrogen containing five-member heterocyclic compound can be represented by following chemical formula (11),

[Chemical Formula (11)]

wherein the "R1" in the chemical formula (11) represents a first organic group or hydrogen, and the aforesaid first organic group is selected from the group consisting of: ether, alcohol, acid, alkyl, alkene, alkyne, benzene, phenol, and benzoic acid; besides, the nitrogen containing five-member heterocyclic compound represented by the chemical formula (11) is a 1,5-R1-tetrazole.

The nitrogen containing five-member heterocyclic compound represented by the chemical formula (11) can further contain at least one second organic group or hydrogen, such that the nitrogen containing five-member heterocyclic compound becomes a positive ion, and then through making the nitrogen containing five-member heterocyclic compound further contain at least one negative ion to achieve charge balance for the chemical structure of the nitrogen containing five-member heterocyclic compound. Wherein the nitrogen containing five-member heterocyclic compound containing one second organic group or hydrogen is represented by following chemical formula (12), chemical formula (13) or chemical formula (14); the nitrogen containing five-member heterocyclic compound containing two second organic groups or hydrogen is represented by following chemical formula (15), chemical formula (16), or chemical formula (17); moreover, the nitrogen containing five-member heterocyclic compound containing three second organic groups or hydrogen is represented by following chemical formula (18),

[Chemical Formula (12)]

[Chemical Formula (13)]

[Chemical Formula (14)]

[Chemical Formula (15)]

[Chemical Formula (16)]

[Chemical Formula (17)]

[Chemical Formula (18)]

wherein the "R2" in the chemical formulas (12)-(18) represents a second organic group or hydrogen, and the aforesaid second organic group is selected from the group consisting of: ether, alcohol, acid, alkyl, alkene, alkyne, benzene, phenol, and benzoic acid; moreover, the negative ion is selected from the group consisting of: $F^-$, $Cl^-$, $Br^-$, $I^-$, $BF_4^-$, $SO_4^{2-}$, and $HSO_4^-$.

Figure 4:
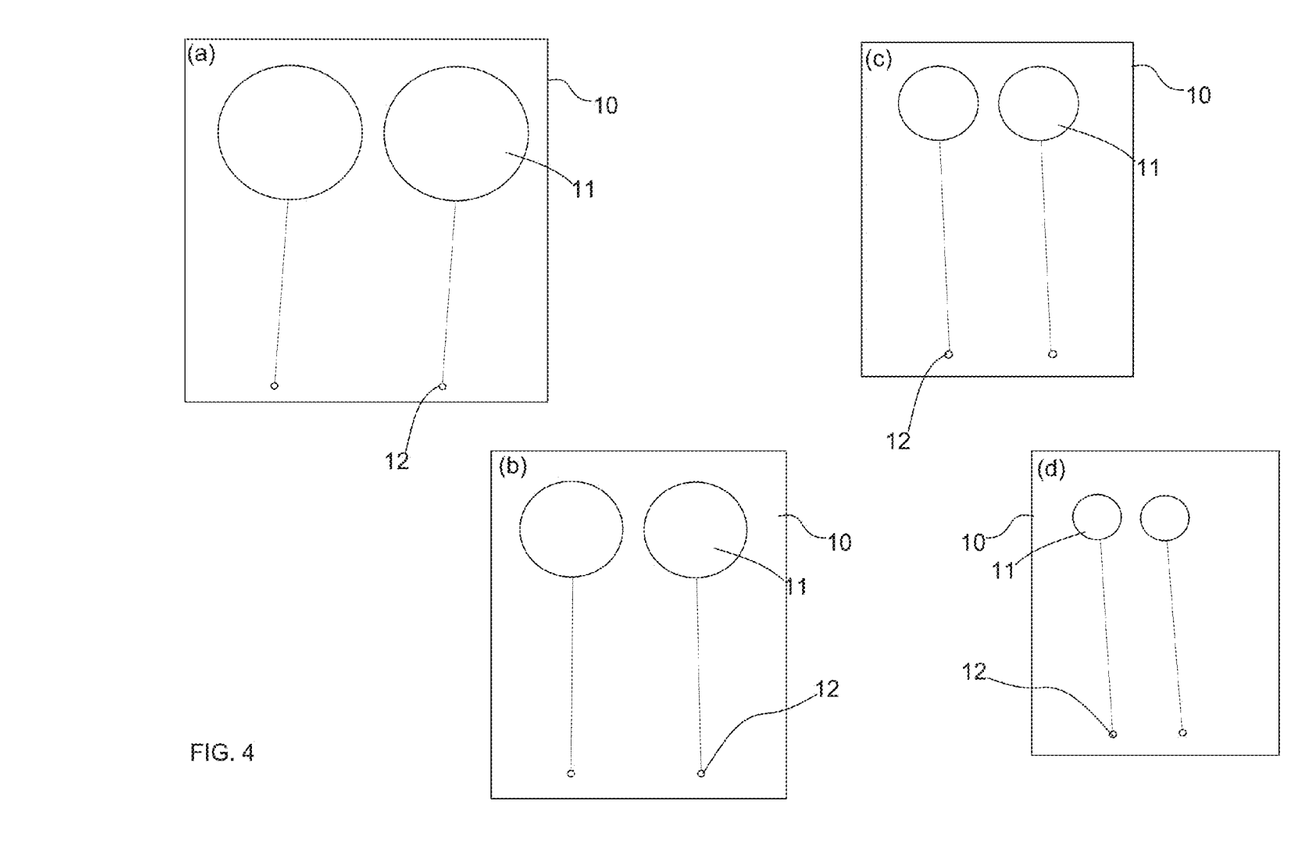
FIG. 4 is a top view diagram of the substrate composed by a gold layer and a copper layer according to the present invention.
Figure 5:
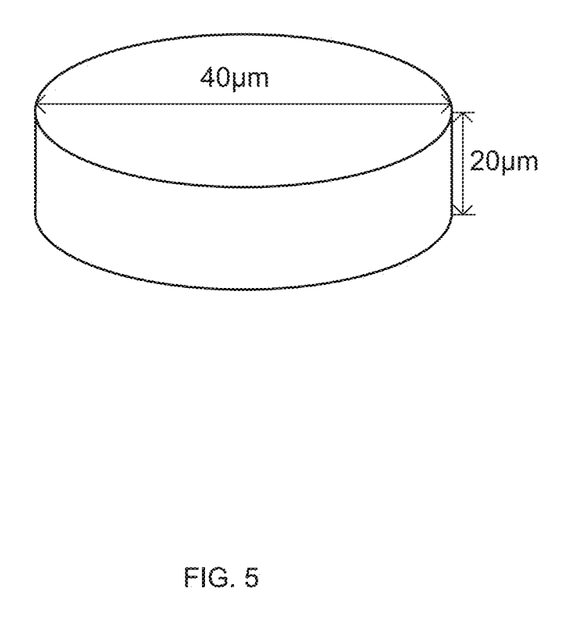
FIG. 5 is a schematic diagram of the copper layer.

Thus, through the descriptions, the composition and the chemical structure of the etching solution capable of effectively reducing Galvanic effect provided by the present invention has been completely introduced and disclosed; next, a variety of experiment data will be presented for proving the practicability and performance of the etching solution. Please refer to FIG. 4 and FIG. 5, which illustrates a top view diagram of the substrate composed by a gold layer and a copper layer, and a schematic diagram of the copper layer. FIG. 4(a) shows a first experimental group and a first control group, and both the first experimental group and the first control group include a substrate 10 having a gold layer 11 and a copper layer 12 connecting with the gold layer 11, wherein the area ratio of the gold layer 11 and the copper layer 12 is 1000:1. Besides, as shown in FIG. 5, the diameter and height of the copper layer 12 is 40 μm and 20 μm, respectively.

Moreover, FIG. 4(b) also shows a second experimental group and a second control group, and both the second experimental group and the second control group include a substrate 10 having a gold layer 11 and a copper layer 12 connecting with the gold layer 11, wherein the area ratio of the gold layer 11 and the copper layer 12 is 500:1. Also, FIG. 4(c) shows a third experimental group and a third control group, and both the third experimental group and the third control group include a substrate 10 having a gold layer 11 and a copper layer 12 connecting with the gold layer 11, wherein the area ratio of the gold layer 11 and the copper layer 12 is 250:1. Furthermore, FIG. 4(d) also shows a fourth experimental group and a fourth control group, and both the fourth experimental group and the fourth control group include a substrate 10 having a gold layer 11 and a copper layer 12 connecting with the gold layer 11, wherein the area ratio of the gold layer 11 and the copper layer 12 is 100:1.

Experiment I

In experiment I, a 10% sulfuric acid and a 3% hydrogen peroxide are dissolved in the water for blending a first control etching solution; on the other hand, a 10% sulfuric acid, a 3% hydrogen and a 1,5-diphenyl tetrazole are dissolved in the water for blending a first experiment etching solution, wherein the 1,5-diphenyl tetrazole is represented by following chemical formula (19),

[Chemical Formula (19)]

Figure 6:
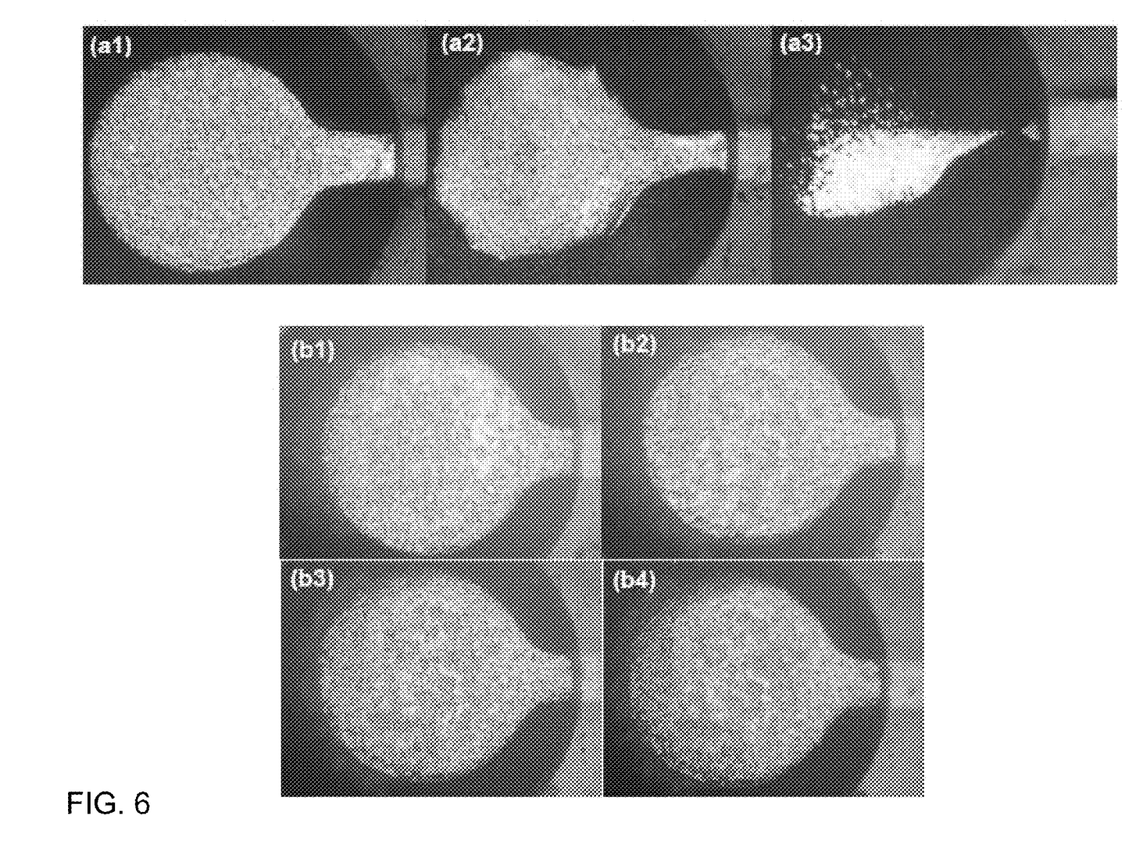
FIG. 6 is a microscopic diagram of the copper layer of experiment I.

Please refer to FIG. 6, which illustrates a microscopic diagram of the copper layer of experiment I, wherein the microscopic diagram of the experimental group and the control group of the copper layer before treating the wet etching process shows in FIG. 6(a1) and FIG. 6(b1), respectively. Then, it is treating a wet etching process to the first control group and the first experimental group shown in FIG. 4(a) by the first control etching solution and the first experiment etching solution, respectively. After being treating the wet etching process 30 s and 60 s, as shown in FIG. 6(a2) and FIG. 6(a3), the cooper layer 10 of the control group is obviously over-etched results from the galvanic effect. On the contrary, please refer to FIG. 6(b2), FIG. 6(b3) and FIG. 6(b4), which illustrate the cooper layer 10 of the experimental group after being treating the wet etching process 30 s, 90 s and 150 s, respectively, wherein the cooper layer 10 of the experimental group is still keeping the complete surface, which indicates that the first experiment etching solution is able to reduce Galvanic effect effectively.

Experiment II

Moreover, in experiment II, a 10% sulfuric acid and a 3% hydrogen peroxide are dissolved in the water for blending a second control etching solution; on the other hand, a 10% sulfuric acid, a 3% hydrogen and a 1-phenyl-1,2,4-triazole are dissolved in the water for blending a second experiment etching solution, wherein the 1-phenyl-1,2,4-triazole is represented by following chemical formula (20),

[Chemical Formula (20)]

Figure 7:
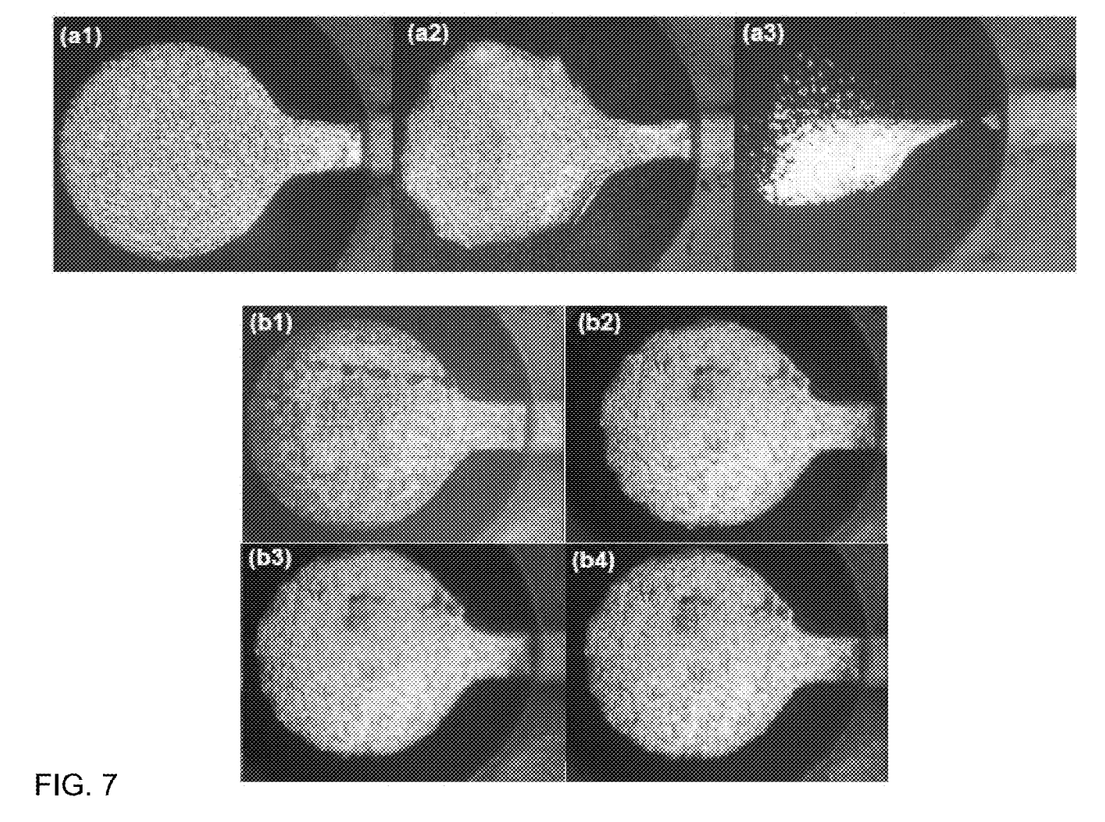
FIG. 7 is a microscopic diagram of the copper layer of experiment II.

Please refer to FIG. 7, which illustrates a microscopic diagram of the copper layer of experiment II, wherein the microscopic diagram of the experimental group and the control group of the copper layer before treating the wet etching process shows in FIG. 7(a1) and FIG. 7(b1), respectively. Then, it is treating a wet etching process to the first control group and the first experimental group shown in FIG. 4(a) by the first control etching solution and the first experiment etching solution, respectively. After being treating the wet etching process 30 s and 60 s, as shown in FIG. 7(a2) and FIG. 7(a3), the cooper layer 10 of the control group is obviously over-etched results from the galvanic effect and even the whole surface of the cooper layer 10 is being etched. On the contrary, please refer to FIG. 7(b2), FIG. 7(b3) and FIG. 7(b4), which illustrate the cooper layer 10 of the experimental group after being treating the wet etching process 30 s, 90 s and 150 s, respectively, wherein the cooper layer 10 of the experimental group is still remaining the complete surface, which indicates that the second experiment etching solution is able to reduce Galvanic effect effectively.

Thus, through the descriptions, the etching solution capable of effectively reducing Galvanic effect have been completely introduced and disclosed; in summary, the present invention has the following advantages:

1. In the present invention, the etching solution is obtained by way of dissolving an etchant and a nitrogen containing five-member heterocyclic compound in water. Thus, when at least one first metal (e.g., gold) and at least one second metal (e.g., copper) disposed on a substrate is treated with a wet etching process by using this etching solution, the nitrogen containing five-member heterocyclic compound would form an organic protecting film on the first metal having higher reduction potential, so as to effectively avoid the second metal from being over etched resulted from the Galvanic effect.

2 Inheriting to above point 1, moreover, the scope of the etchant usage according to the present invention is not limited, so the etchant can be selected from the group consisting of: $H_2O_2$—$H_2SO_4$, $H_2O_2$—$H_3PO_4$, $CuCl_2$—$HCl$, $FeCl_2$—$HCl$, $HCl$—$HNO_3$, $Na_2S_2O_8$, and $KHSO_5 \cdot KHSO_4 \cdot K_2SO_4$, which reveals that the present invention has a widely application aspect.

The above description is made on embodiments of the present invention. However, the embodiments are not intended to limit scope of the present invention, and all equivalent implementations or alterations within the spirit of the present invention still fall within the scope of the present invention.

What is claimed is:

1. An etching solution capable of effectively reducing Galvanic effect, being used for treating a wet etching process to a first metal and a second metal disposed on a substrate, comprising:
   an etchant, being dissolved in a solvent so as to form an etching solution; and
   a nitrogen containing five-member heterocyclic compound, being dissolved in the etching solution for forming an organic protecting film on the surface of the first metal during the wet etching process;
   wherein the content of the etching solvent dissolved in the solution is ranged from 5 g/L to 250 g/L, and the content of the nitrogen containing five-member heterocyclic compound dissolved in the etching solution is ranged from 0.01 g/L to 50 g/L;
   wherein the nitrogen containing five-member heterocyclic compound is a 1,4,5-R1-1,2,3-triazole and represented by following chemical formula (7), and the said 1,4,5-R1-1,2,3-triazole can be further contained with one or two second organic groups or hydrogen so as to make the nitrogen containing five-member heterocyclic compound carry with a positive ion, and then by letting the nitrogen containing five-member heterocyclic com- pound contain at least one negative ion for making the chemical formula achieve charge balance; wherein the nitrogen containing five-member heterocyclic compound containing a second organic group or hydrogen represented by following chemical formula (8) or chemical formula (9); moreover, the nitrogen containing five-member heterocyclic compound containing two second organic group or hydrogen represented by following chemical formula (10),

[Chemical Formula (7)]

[Chemical Formula (8)]

[Chemical Formula (9)]

[Chemical Formula (10)]

wherein R1 in the chemical formula (7) represents a first organic group or hydrogen, and the aforesaid first organic group is selected from the group consisting of: ether, alcohol, acid, alkyl, alkene, alkyne, benzene, phenol, and benzoic acid;

wherein R2 in the chemical formula (8), chemical formula (9), or chemical formula (10) represents a second organic group or hydrogen, and the aforesaid second organic group is selected from the group consisting of: ether, alcohol, acid, alkyl, alkene, alkyne, benzene, phenol, and benzoic acid; moreover, the negative ion is selected from the group consisting of: $F^-$, $Cl^-$, $Br^-$, $I^-$, $BF_4^-$, $SO_4^{2-}$, and $HSO_4^-$.

2. The etching solution capable of effectively reducing Galvanic effect of claim 1, wherein the solvent is water ($H_2O$).

3. The etching solution capable of effectively reducing Galvanic effect of claim 1, wherein the etchant is selected from the group consisting of: $H_2O_2$—$H_2SO_4$, $H_2O_2$—$H_3PO_4$, $CuCl_2$—$HCl$, $FeCl_2$—$HCl$, $HCl$—$HNO_3$, $Na_2S_2O_8$, and $KHSO_5 \cdot KHSO_4 \cdot K_2SO_4$.

4. The etching solution capable of effectively reducing Galvanic effect of claim 1, wherein the reduction potential of the first metal is higher than the reduction potential of the second metal.

5. The etching solution capable of effectively reducing Galvanic effect of claim 4, wherein the first metal is selected from the group consisting of: Au, Pt, Ag, Cu, Sn, Ni, and Al.

6. The etching solution capable of effectively reducing Galvanic effect of claim 5, wherein the second metal is selected from the group consisting of: Al, Ni, Sn, Cu, Ag, Pt, Ti, Fe, Co, and Cr.

7. The etching solution capable of effectively reducing Galvanic effect of claim 5, wherein the substrate is selected from the group consisting of: printed circuit board, wafer, glass substrate, gallium arsenide, and alumina.

8. An etching solution capable of effectively reducing Galvanic effect, being used for treating a wet etching process to a first metal and a second metal disposed on a substrate, comprising:

an etchant, being dissolved in a solvent so as to form an etching solution; and a nitrogen containing five-member heterocyclic compound, being dissolved in the etching solution for forming an organic protecting film on the surface of the first metal during the wet etching process;

wherein the content of the etching solvent dissolved in the solution is ranged from 5 g/L to 250 g/L, and the content of the nitrogen containing five-member heterocyclic compound dissolved in the etching solution is ranged from 0.01 g/L to 50 g/L;

wherein the nitrogen containing five-member heterocyclic compound is a 1,5-R1-tetrazole and represented by following chemical formula (11), and the said 1,5-R1-tetrazole can be further contained with at least one second organic group or hydrogen, such that the nitrogen containing five-member heterocyclic compound becomes a positive ion, and then the chemical structure of the nitrogen containing five-member heterocyclic compound may achieve charge balance through making the nitrogen containing five-member heterocyclic compound further contain at least one negative ion; wherein the nitrogen containing five-member heterocyclic compound containing one second organic group or hydrogen is represented by following chemical formula (12), chemical formula (13) or chemical formula (14); the nitrogen containing five-member heterocyclic compound containing two second organic groups or hydrogen is represented by following chemical formula (15), chemical formula (16), or chemical formula (17); moreover, the nitrogen containing five-member heterocyclic compound containing three second organic groups or hydrogen is represented by following chemical formula (18),

[Chemical Formula (11)]

[Chemical Formula (12)]

[Chemical Formula (13)]

[Chemical Formula (14)]

[Chemical Formula (15)]

[Chemical Formula (16)]

[Chemical Formula (17)]

[Chemical Formula (18)]

wherein R1 in the chemical formula (11) represents a first organic group or hydrogen, and the aforesaid first organic group is selected from the group consisting of: ether, alcohol, acid, alkyl, alkene, alkyne, benzene, phenol, and benzoic acid;

wherein R2 represents a second organic group or hydrogen, and the aforesaid second organic group is selected from the group consisting of: ether, alcohol, acid, alkyl, alkene, alkyne, benzene, phenol, and benzoic acid; moreover, the negative ion is selected from the group consisting of: $F^-$, $Cl^-$, $Br^-$, $I^-$, $BF_4^-$, $SO_4^{2-}$, and $HSO_4^-$.

9. The etching solution capable of effectively reducing Galvanic effect of claim 8, wherein the reduction potential of the first metal is higher than the reduction potential of the second metal.

10. The etching solution capable of effectively reducing Galvanic effect of claim 9, wherein the first metal is selected from the group consisting of: Au, Pt, Ag, Cu, Sn, Ni, and Al.

11. The etching solution capable of effectively reducing Galvanic effect of claim 10, wherein the second metal is selected from the group consisting of: Al, Ni, Sn, Cu, Ag, Pt, Ti, Fe, Co, and Cr.

12. The etching solution capable of effectively reducing Galvanic effect of claim 10, wherein the substrate is selected from the group consisting of: printed circuit board, wafer, glass substrate, gallium arsenide, and alumina.

\* \* \* \* \*